United States Patent
Lu et al.

(10) Patent No.: US 6,359,802 B1
(45) Date of Patent: Mar. 19, 2002

(54) ONE-TRANSISTOR AND ONE-CAPACITOR DRAM CELL FOR LOGIC PROCESS TECHNOLOGY

(75) Inventors: Shih-Lien L. Lu, Portland; Vivek K. De, Beaverton, both of OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 09/537,971

(22) Filed: Mar. 28, 2000

(51) Int. Cl.[7] .............................. G11C 5/06; G11C 11/24
(52) U.S. Cl. ........................................ 365/63; 365/149
(58) Field of Search ........................ 365/63, 149, 51; 257/296, 313

(56) References Cited

U.S. PATENT DOCUMENTS

| | | | |
|---|---|---|---|
| 5,694,355 A | * 12/1997 | Skjaveland et al. | 365/149 |
| 5,870,329 A | * 2/1999 | Foss | 365/149 |
| 5,943,270 A | 8/1999 | Borkar | 365/189.01 |
| 6,075,720 A | * 6/2000 | Leung et al. | 365/149 |

OTHER PUBLICATIONS

Foss, Richard C., "Implementing Application Specific Memory," 1996 IEEE International Solid–State Circuits Conference, Technology Directions: Memory, Paper FP 16.1, 2 pages, Feb. 1996.

Gillingham, et al., "A 768k Embedded DRAM for 1.244Gb/s ATM Switch in a 0.8$\mu$m Logic Process," 1996 IEEE ISSCC Technology Directions: Memory, Paper FP 16.2, 2 pages, Feb. 1996.

\* cited by examiner

*Primary Examiner*—Richard Elms
*Assistant Examiner*—Anh Phung
(74) *Attorney, Agent, or Firm*—Michael Newsheiwat

(57) ABSTRACT

A memory cell including two switching devices, a bit line and a word line. The first switching device has an enable input. The second switching device is configured to store a charge, which deactivates the second switching device. The bit line is coupled to the first switching device. The first switching device is coupled to second switching device. The word line is coupled to the enable input of the first switching device.

17 Claims, 4 Drawing Sheets

ONE-TRANSISTOR AND ONE-CAPACITOR DRAM CELL FOR LOGIC PROCESS TECHNOLOGY

BACKGROUND OF THE INVENTION

1. Field of the Invention

The present invention relates generally to dynamic random access memory (DRAM), and more specifically to a one-transistor and one-capacitor DRAM cell for logic process technology.

2. Description of the Related Art

The demand for quicker and more powerful personal computers has led to many technological advances in the computer industry, including combining logic devices and memory elements on the same integrated circuit. However, the technologies for logic devices and memory elements are diverging due to different requirements. Logic circuits need fast transistors and efficient connectivity and require extremely thin gate oxides and multiple metal layers. However, thin gate oxides create leakage problems for high-density memory elements. Presently, gate oxides are 15 Angstroms in thickness.

Higher memory bandwidth is driving the need for higher density memory elements with metal oxide semiconductor (MOS) diodes processed with logic technology. A dynamic random access memory cell with a thin gate oxide designed based on sub-micron logic technology has multiple leakage sources. The leakage sources are a) the sub-threshold drain to source leakage, b) the junction leakage, and c) the gate to substrate leakage. Memory cells require frequent refresh rates due to excessive leakage. The size of a capacitor is directly proportional to the amount of charge stored in the capacitor. However, a larger capacitor results in higher gate to substrate leakage since the leakage is proportional to the area of the MOS thin gate oxide diode capacitor.

MOS capacitors have different values depending on the state of the semiconductor surface. An accumulation layer is formed when the gate to substrate voltage (Vgs) is less than 0 for a p-substrate structure. The MOS capacitor operates as a parallel-plate capacitor if an accumulation layer is present, where the gate is one plate of the capacitor and the high concentration of holes in a p-substrate is the other plate of the capacitor. A depletion layer is formed under the gate by applying a slightly positive voltage Vgs. The positive voltage repels holes and forms a negatively charged layer depleted of carriers. As gate to substrate voltage (Vgs) further increases, minority carriers are attracted to the surface and invert the silicon to form a n-type layer or channel.

Similarly, with a n-substrate structure, if Vgs is greater than zero the surface is in the accumulation mode and the gate layer acts a plate of the capacitor while the substrate acts as the second plate of the capacitor. Applying a small negative Vgs forms a depletion layer. An inversion layer is formed at the surface by utilizing a larger negative Vgs. However, transistors operating in inversion mode with thin gate oxides have high gate to substrate leakage.

BRIEF DESCRIPTION OF THE SEVERAL VIEWS OF THE DRAWINGS

The present invention is illustrated by way of example and not limitation in the following figures. Like references indicate similar elements, in which.

DETAILED DESCRIPTION OF THE INVENTION

A method for creating a memory cell, and specifically for creating a DRAM cell with one-transistor and one-capacitor for logic process technology. In the following description, for purposes of explanation, numerous details are set forth in order to provide a thorough understanding of the present invention. However, it will be apparent to one skilled in the art that these specific details are not required in order to practice the present invention.

Figure 1:
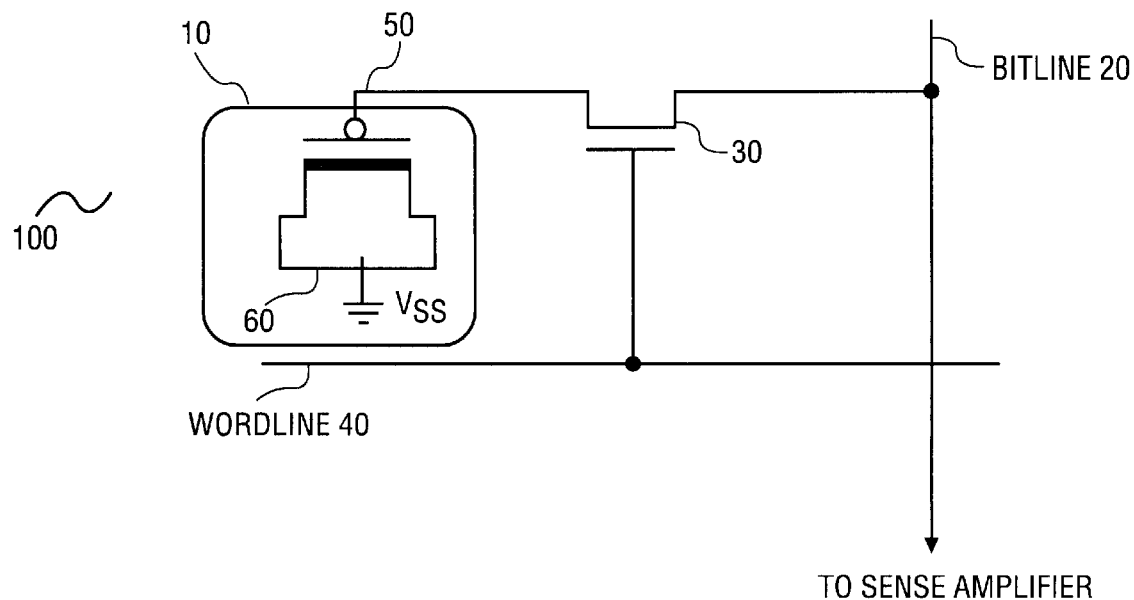
FIG. 1 shows a circuit in accordance with the present invention.

FIG. 1 illustrates circuit 100 in accordance with the present invention. Circuit 100 is a memory cell comprising a first switching device 30, a second switching device 10, a bitline 20, and a wordline 40. The memory cell 100 stores a charge in the second switching device 10. The bitline 20 is coupled to a sense amplifier. The sense amplifier reads the charge and interprets whether the cell is storing a 0 or 1. The procedure for writing to and reading from the memory cell is discussed in the next several paragraphs.

Circuit 100 utilizes n-well technology. A source terminal of the first switching device 30 is coupled to the bitline 20. A drain terminal of the first switching device 30 is coupled to a node 50 of the second switching device 10. A ground power supply, Vss, is coupled to a node 60 of the second switching device. A gate terminal of the first switching device 30 is coupled to the wordline 40. In one embodiment, the first switching device is a n channel metal oxide silicon field effect transistor (MOSFET) and the second switching device is a p channel MOSFET.

The inherent gate capacitance of the second switching device is capable of storing a charge. The basic operation of a switching device, a transistor, consists of applying a bias voltage, Vgs, to the gate terminal of the device greater than the threshold voltage, Vt, which results in activating the transistor and results in the transistor conducting current. The configuration of the second switching device 10 emulates a capacitor. For example, node 50 emulates one plate of the capacitor and stores the charge, and node 60 is the other plate of the capacitor and is coupled to Vss and the substrate.

In accordance with the present invention, the second switching device is optimally configured for operating in both accumulation and depletion modes. The accumulation mode occurs when the bias voltage, Vgs, is substantially less than the inherent threshold voltage, Vt, of the transistor. The threshold voltage, Vt, is the voltage at which a MOS begins to conduct. The depletion mode occurs when the bias voltage, Vgs, is substantially near the inherent threshold voltage, Vt, of the transistor. Therefore, the accumulation and depletion modes are inactive modes in which the transistor is deactivated, that is, not actively conducting current. In contrast, inversion mode is an active mode since the transistor is actively conducting current. One advantage of operating a transistor in the accumulation and depletion modes, rather than inversion mode, is minimizing the gate to substrate leakage since the leakage is proportional to Vgs. Therefore, due to the lower gate to substrate leakage, one can aggressively increase the memory density and reduce refresh time in a particular application.

The write operation of circuit 100 comprises applying a charge to the inherent gate capacitance of the second switching device 10. The first step in writing to the cell is precharging the bitline 20 to either one of two voltages. If writing a "1" to the cell, the bitline is precharged to the power supply voltage, Vcc, minus Vt (Vcc-Vt). In one embodiment, Vcc is 1.3 volts and Vt ranges from 0.2 to 0.3 volts. If writing a "0" to the cell, the bitline is precharged to 0.2 volts in one embodiment of the invention. The second step is precharging the wordline 40 to Vcc. The third step is applying a bias voltage, Vgs, greater than the inherent threshold voltage, Vt, to the gate terminal of the first switching device 30 via the wordline 40. Therefore, the first switching device 30 starts conducting current and a charge is transferred from the bitline 20 to node 50 of the second switching device 10.

The read operation of circuit 100 comprises sensing the amount of charge stored in the inherent gate capacitance of the second switching device 10. The first step in reading from the cell is precharging the bitline 20 to approximately half of the power supply voltage, Vcc. In one embodiment, Vcc is 1.3 volts. Therefore, the bitline 20 is precharged to 0.65 volts. The second step in reading the cell is applying a bias voltage, Vgs, greater than the inherent threshold voltage, Vt, to the gate terminal of the first switching device 30 via the wordline 40 so that the first switching device 30 starts conducting current. When the first switching device 30 is conducting, there is a charge sharing between node 50 of the second switching device 10 and the bitline 20. Charge sharing either increases or decreases the voltage on the bitline. The voltage on the bitline 20 depends on the amount of charge stored in the inherent gate capacitance of the second switching device 10. A sense amplifier coupled to the bitline 20 determines the actual voltage on the bitline 20. If the voltage on the bitline 20 increases above the precharge level of 0.65 volts, then the cell is interpreted as having stored a 1. If the voltage on the bitline 20 decreases below 0.65 volts, then the cell is interpreted as having stored a 0.

Those skilled in the art will further appreciate utilizing various embodiments of different power supply voltages, different precharging voltages to the bitline, different capacitor charges, and different circuit layouts. Many factors affect the voltage, charge and layout embodiments including the number of rows in a bitline, sense amp size, transistor sizing, gate oxide thickness, and threshold voltage levels of the transistors.

In an alternative embodiment of the present invention the connections of node 50 and node 60 of the second switching device are switched. For example, node 60 becomes the gate enable input and is coupled to a Vcc power supply, and node 50 is coupled to the substrate and the first switching device 30. Therefore, the second switching 10 still operates as a capacitor, but the charge is stored in the substrate rather than in the inherent gate capacitance of the second switching device 10.

Figure 2:
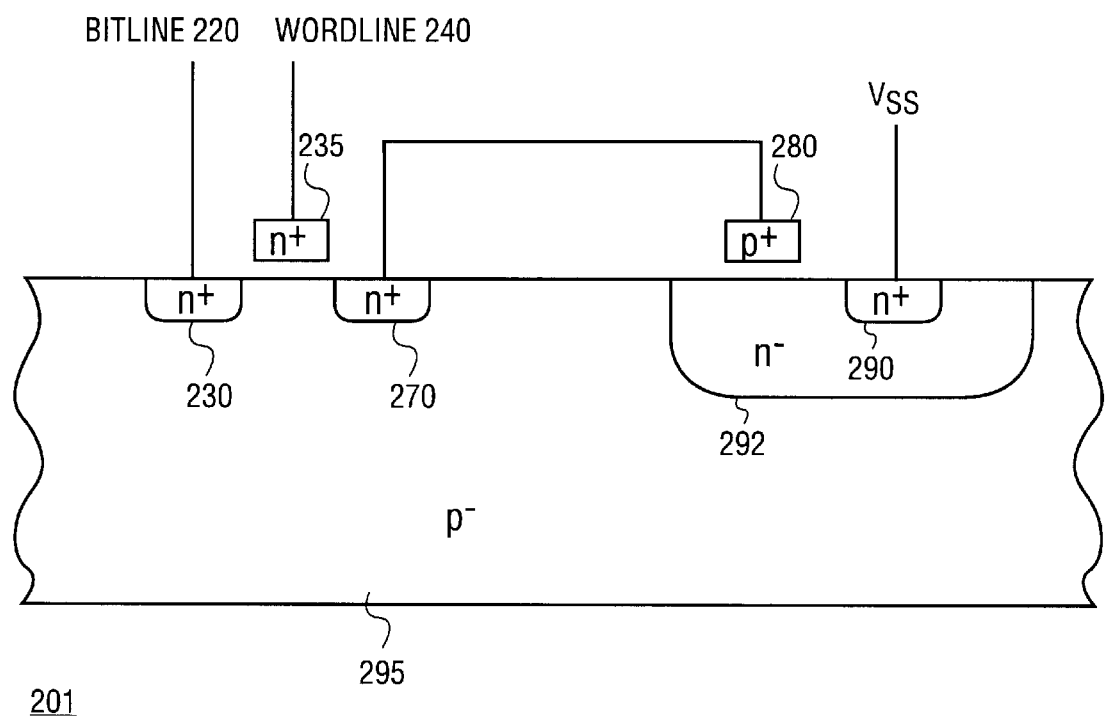
FIG. 2 shows a cross-section view of the circuit in FIG. 1.

FIG. 2 illustrates a cross section view 201 of circuit 100 in accordance with an embodiment of the present invention. The cross section view illustrates all the elements discussed in FIG. 1, the bitline 20, the wordline 40, the first switching device 30, and the second switching device 10. The cross section view of 201 depicts a transistor configured to operate in one of accumulation and depletion mode.

The following description of the cross section view 201 discusses how each connection in FIG. 2 correlates to the circuit connections in FIG. 1. The cross section view depicts bitline 20 contacting with a n+active region 30 which correlates to the bitline 220 connection to the source terminal of the first switching device 230 in FIG. 1. The cross section view depicts the wordline 240 coupled to a transfer gate 235 which correlates to wordline 40 coupled to the gate terminal of the first switching device 30 in FIG. 1. The cross section view depicts a connection between a n+active region 270 and a p+active region 280 which correlates to the connection of the drain terminal of the first switching device 30 to node 50 of the second switching device 10. Finally, the cross section view depicts Vss coupled contact to a n+active region 290 above a n-well 292 which correlates to the Vss coupled to node 60 of the second switching device 10 in FIG. 1. The cross section view of 201 also contains a p-substrate 295. In one embodiment, the p-substrate is coupled to a bias voltage for controlling the sub threshold drain source leakage current.

Figure 3:
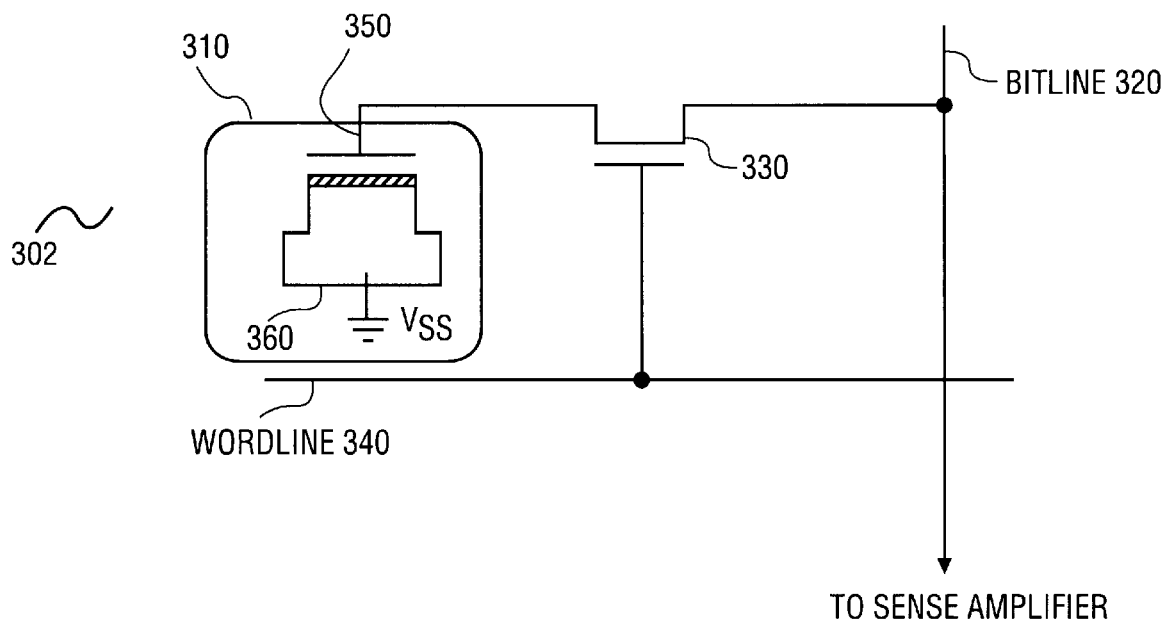
FIG. 3 shows a circuit in accordance with the present invention.

FIG. 3 illustrates an alternative embodiment circuit 302 in accordance with the present invention. The second switching device 310 is a n channel depletion MOSFET, rather than a p channel MOSFET 10 as illustrated in FIG. 1. Otherwise, the operation of FIG. 3 is similar to the above description with reference to FIG. 1.

Figure 4:
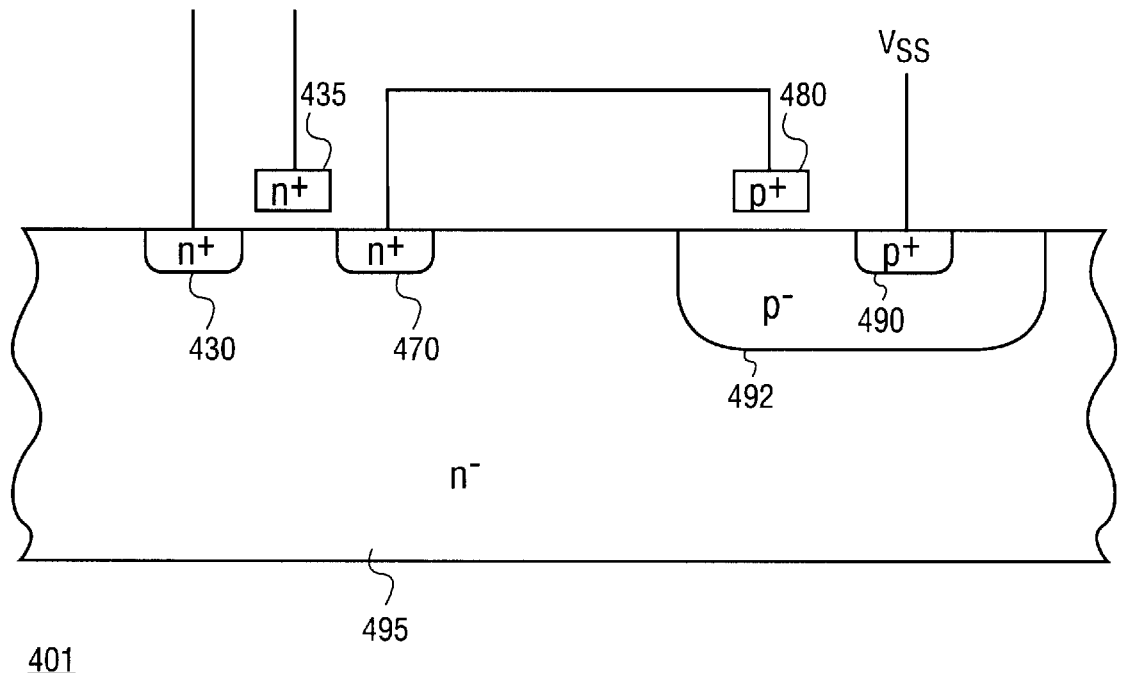
FIG. 4 shows a cross-section view of the circuit in FIG. 3.

FIG. 4 illustrates a cross section view 401 of circuit 302. The cross section view 401 is similar to the cross section view 201 of FIG. 2 except that Vss is coupled to a p+active region 490, there is a p well 92 rather than a n well, and a n substrate 495.

Figure 5:
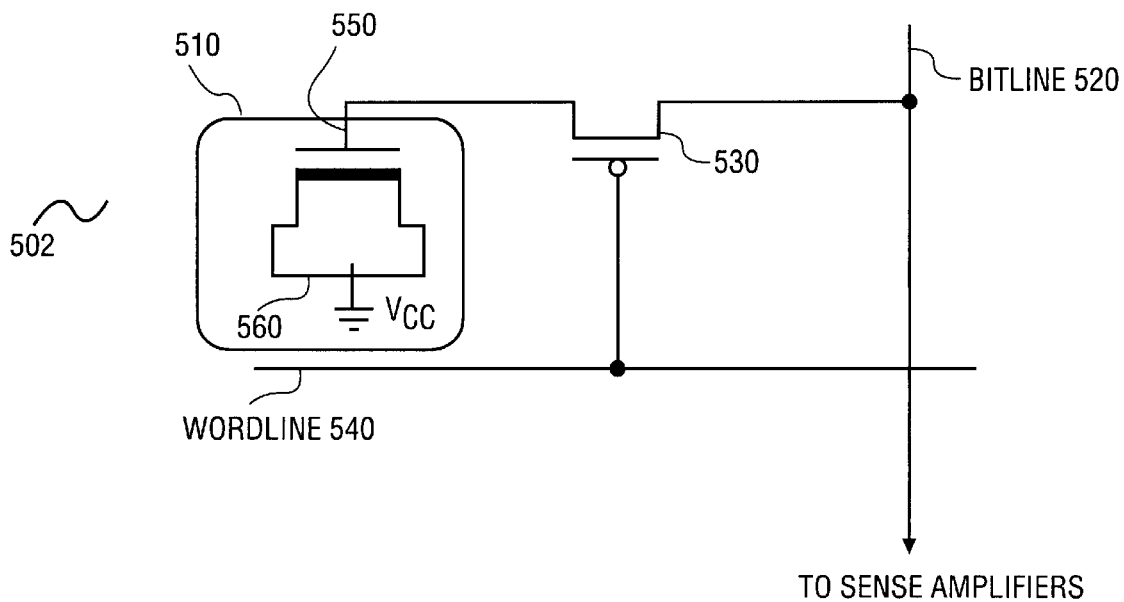
FIG. 5 shows a circuit in accordance with the present invention.

FIG. 5 illustrates circuit 502 in accordance with another embodiment of the present invention. The first switching device 30 is a p channel MOSFET, rather than a n channel MOSFET 30 in FIG. 1. Also, the second switching device 510 is a n channel MOSFET rather than a p channel MOSFET 10 in FIG. 1. Furthermore, node 560 is coupled to Vcc and the substrate, rather than to Vss and the substrate in FIG. 1. Otherwise, the operation of circuit 502 is similar to the operation of circuits 100 and 302.

Figure 6:
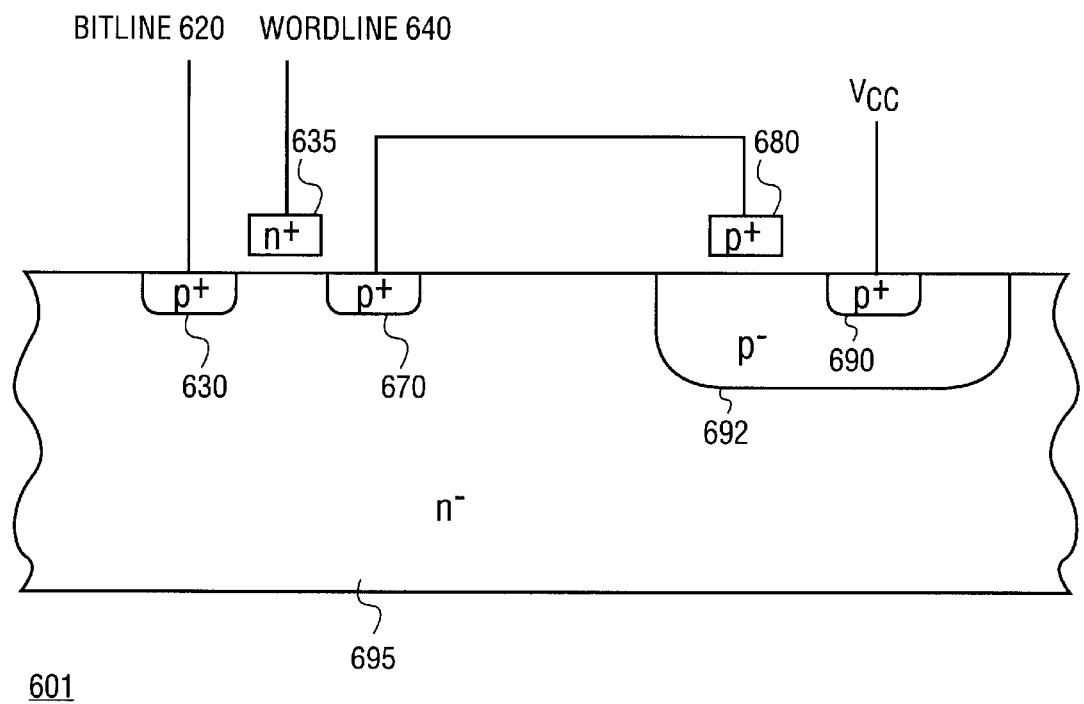
FIG. 6 shows a cross-section view of the circuit in FIG. 5.

FIG. 6 illustrates a cross section view 601 of circuit 502. The following description of the cross section view 601 discusses how each connection in FIG. 6 correlates to circuit connections in FIG. 5. The cross section view depicts bitline 620 contacting with a p+active region 630 which correlates to the bitline 520 connecting to the source terminal of the first switching device 530 in FIG. 5. The cross section view depicts the wordline 640 coupled to a transfer gate 635 which correlates to wordline 540 coupled to the gate terminal of the first switching device 530 in FIG. 5. The cross section view depicts a connection between two p+active regions 670 and 680 which correlates to the connection of the drain terminal of the first switching device 530 to node 550 of the second switching device 10 in FIG. 5. Finally, the cross section view depicts a Vcc contact to a p+active region 690 above a p-well 692 which correlates to the Vcc contact to the node 560 of the second switching device 510 in FIG. 5.

Figure 7:
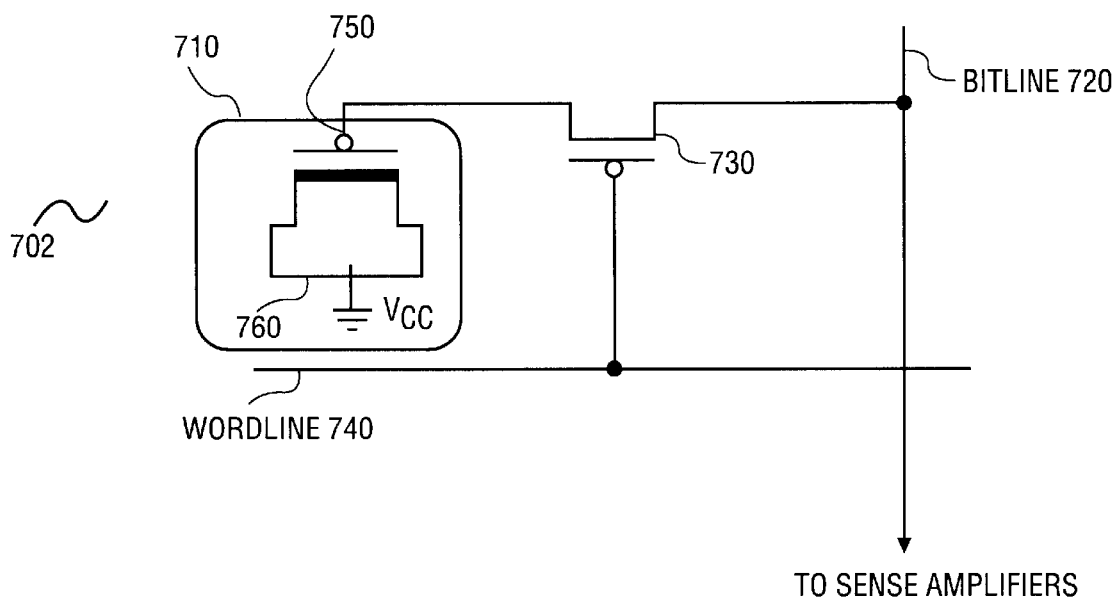
FIG. 7 shows a circuit in accordance with the present invention.

FIG. 7 illustrates an alternative embodiment 702 in accordance with the present invention. The second switching device 710 is a p channel MOSFET, rather than a n channel MOSFET 510 as illustrated in FIG. 5. Otherwise, the operation of this embodiment is similar to operations of the embodiments described with reference to FIG. 1, FIG. 3 and FIG. 5.

Figure 8:
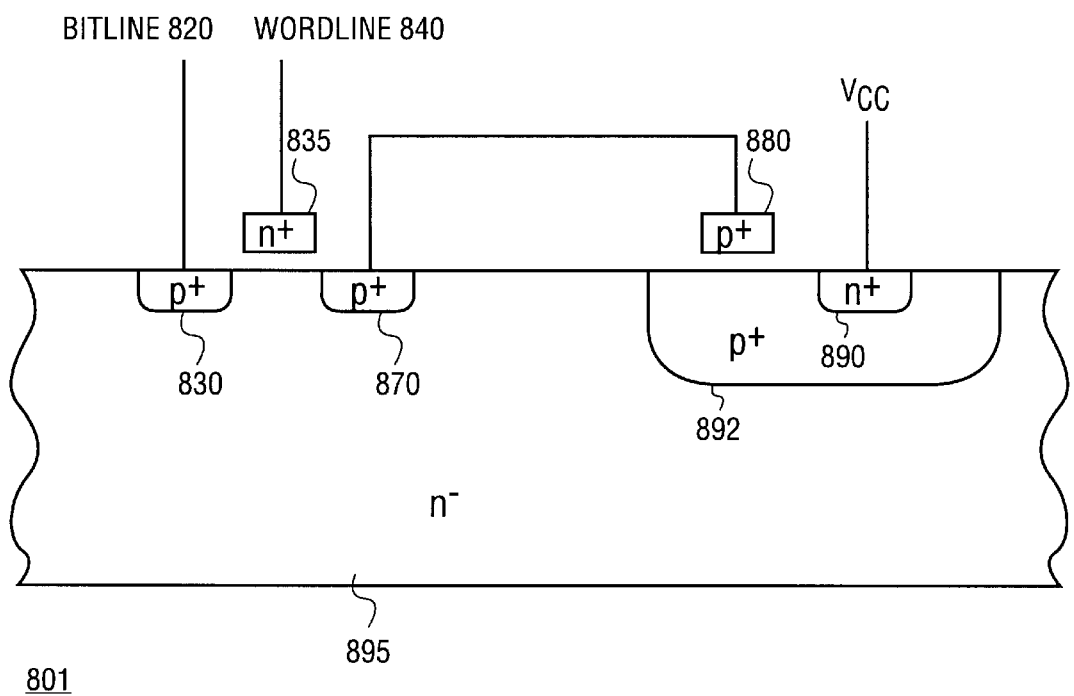
FIG. 8 shows a cross-section view of the circuit in FIG. 7.

FIG. 8 illustrates a cross section view 801 of circuit 702. The cross section view 801 is similar to the cross section view 601 except that Vcc is coupled to a n+active region 890.

Producing a plurality of the memory cells depicted in FIGS. 1–8 forms an integrated circuit. A silicon die contains a plurality of integrated circuits. A plurality of silicon die is fabricated on a silicon wafer.

Although the invention has been described with reference to specific embodiments, this description is not meant to be construed in a limiting sense. Various modifications of the disclosed embodiment, as well as alternative embodiments of the invention, will become apparent to persons skilled in the art upon reference to the description of the invention. It is contemplated, therefore, that such modifications can be made without departing from the spirit or scope of the present invention as defined in the appended claims.

What is claimed is:

1. A memory cell comprising:
   a first switching device in a n-type substrate having an enable input;
   a second switching device in a p-type well to store a charge to deactivate the second switching device;
   a bit line, coupled to the second switching device and the first switching device; and
   a word line coupled to the enable input of the first switching device.

2. The memory cell of claim 1 wherein the first and second switching devices are both p channel MOSFETs.

3. The memory cell of claim 1 wherein the first and second switching devices are both n channel MOSFETs.

4. The memory cell of claim 1 wherein the first switching device is a p channel MOSFET and the second switching device is a n channel MOSFET.

5. The memory cell of claim 1 wherein the scond switching device is configured to operate in one of accumulation mode and depletion mode.

6. The memory cell of claim 1 wherein the second switching device is a capacitor.

7. The memory cell of claim 1 wherein the memory cell is formed on a silicon wafer having a plurality of memory die formed thereon.

8. The memory cell of claim 1 wherein the memory cell is formed on a silicon wafer having a plurality of logic die formed thereon.

9. The memory cell of claim 1 wherein the memory cell is formed on a die.

10. A memory cell comprising:
    a first switching device in a p-type substrate having an enable input;
    a second switching device in a n-type well;
    a bit line, coupled to the second switching device and the first switching device;
    a word line, coupled to the enable input of the first switching device; and
    a first node of the second switching device coupled to a power supply.

11. The memory of cell of claim 10 wherein the bit line is precharged to half of Vcc, a power supply.

12. The memory cell of claim 10 wherein the first switching device is a n channel MOSFET and the second switching device is a p channel MOSFET.

13. The memory cell of claim 10 wherein the memory cell is formed on a silicon wafer having a plurality of memory die formed thereon.

14. The memory cell of claim 10 wherein the memory cell is formed on a silicon wafer having a plurality of logic die formed thereon.

15. The memory cell of claim 10 wherein the memory cell is formed on a die.

16. The memory cell of claim 10 wherein the first node of the second switching device is coupled to a ground supply.

17. The memory cell of claim 10 wherein the second switching device is a capacitor.

* * * * *

UNITED STATES PATENT AND TRADEMARK OFFICE
CERTIFICATE OF CORRECTION

PATENT NO.    : 6,359,802 B1
DATED         : March 19, 2002
INVENTOR(S)   : Lu et al.

It is certified that error appears in the above-identified patent and that said Letters Patent is hereby corrected as shown below:

Column 4,
Line 32, delete "92", insert -- 492 --.

Signed and Sealed this

Tenth Day of December, 2002

JAMES E. ROGAN
*Director of the United States Patent and Trademark Office*